United States Patent
Treiblmayr

(10) Patent No.: US 11,131,021 B2
(45) Date of Patent: Sep. 28, 2021

(54) MOULD WITH A MOULD PATTERN, AND DEVICE AND METHOD FOR PRODUCING SAME

(71) Applicant: EV GROUP E. THALLNER GMBH, St. Florian am Inn (AT)

(72) Inventor: Dominik Treiblmayr, Kirchdorf am Inn (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 296 days.

(21) Appl. No.: 14/787,872

(22) PCT Filed: Jun. 20, 2013

(86) PCT No.: PCT/EP2013/062922
§ 371 (c)(1),
(2) Date: Oct. 29, 2015

(87) PCT Pub. No.: WO2014/202145
PCT Pub. Date: Dec. 24, 2014

(65) Prior Publication Data
US 2016/0076147 A1    Mar. 17, 2016

(51) Int. Cl.
*C23C 16/455* (2006.01)
*G03F 7/20* (2006.01)
(Continued)

(52) U.S. Cl.
CPC ........ *C23C 16/45525* (2013.01); *C23C 14/06* (2013.01); *C23C 14/22* (2013.01);
(Continued)

(58) Field of Classification Search
CPC ... B29C 2043/025; C23C 14/06; C23C 14/22; C23C 16/06; C23C 16/22;
(Continued)

(56) References Cited

U.S. PATENT DOCUMENTS 6,566,016 B1 * 5/2003 Ziger ............... G03F 7/70191
430/30
6,916,511 B2  7/2005 Lee et al. ............... 427/569
(Continued)

FOREIGN PATENT DOCUMENTS

EP    1 840 648 A1   10/2007 ............. G03F 7/00
JP    2004-148494 A   5/2004 ............. B82B 3/00
(Continued)

OTHER PUBLICATIONS

Rolland et al. "High-Resolution Soft Lithography: Enabling Materials for Nanotechnologies," Angew. Chem. Int. Ed., 43:5796-5799 (2004) ("ROLLAND"). (Year: 2004).*
(Continued)

*Primary Examiner* — Joseph S Del Sole
*Assistant Examiner* — Manley L Cummins, IV
(74) *Attorney, Agent, or Firm* — Kusner & Jaffe

(57) ABSTRACT

A method for the production of a structural die that has die structures for applying microstructures and/or nanostructures on substrates or soft dies, whereby the die structures are coated at least partially with a coating. In addition, the invention relates to a corresponding structural die as well as a device for the production of a structural die that has die structures for applying microstructures and/or nanostructures on substrates or soft dies, whereby the device has coating means for coating the die structures.

6 Claims, 1 Drawing Sheet

(51) Int. Cl.

| | | |
|---|---|---|
| *G03F 7/00* | (2006.01) | |
| *C23C 14/06* | (2006.01) | |
| *C23C 14/22* | (2006.01) | |
| *C23C 16/06* | (2006.01) | |
| *C23C 16/22* | (2006.01) | |
| *B29C 43/02* | (2006.01) | |

(52) U.S. Cl.
CPC .............. *C23C 16/06* (2013.01); *C23C 16/22* (2013.01); *G03F 7/0002* (2013.01); *G03F 7/20* (2013.01); *B29C 2043/025* (2013.01); *G03F 7/0005* (2013.01); *G03F 7/0035* (2013.01); *G03F 2007/2067* (2013.01)

(58) Field of Classification Search
CPC ....... C23C 16/45525; G03F 2007/2067; G03F 7/0002; G03F 7/0005; G03F 7/0035; G03F 7/20
See application file for complete search history.

(56) References Cited

U.S. PATENT DOCUMENTS

| | | | |
|---|---|---|---|
| 2003/0178316 A1 | 9/2003 | Jacobs et al. | 205/157 |
| 2005/0230882 A1 | 10/2005 | Watts et al. | 264/496 |
| 2008/0061214 A1* | 3/2008 | Lee | B29C 33/424 249/112 |
| 2009/0246309 A1* | 10/2009 | Washiya | B29C 35/0888 425/174.6 |
| 2011/0180906 A1* | 7/2011 | Wessels | B82Y 10/00 257/618 |
| 2012/0152887 A1* | 6/2012 | Lee | B29C 33/3842 216/11 |
| 2012/0297856 A1* | 11/2012 | Keil | B82Y 10/00 72/379.2 |

FOREIGN PATENT DOCUMENTS

| | | | |
|---|---|---|---|
| JP | 2005-203032 | 7/2005 | .............. G11B 7/26 |
| JP | 2008-068612 A | 3/2008 | ............. B29C 59/02 |
| JP | 2011049374 A | 3/2011 | |
| JP | 2012-227317 A | 11/2012 | ........... H01L 21/027 |
| WO | WO 02/01294 | 1/2002 | ............... G03F 1/14 |
| WO | WO 2011/095217 A1 | 8/2011 | ............... G02F 7/00 |

OTHER PUBLICATIONS

Polymer properties database: Entropy Elasticity of Gaussian Polymer Chains (retrieved Oct. 27, 2019) http://polymerdatabase.com/polymer%20physics/Entropy%20Elasticity.html. (Year: 2015).*

However, Rösler, J., Harders, H. and Bäker, M., 2007. Mechanical Behaviour Of Engineering Materials. Berlin: Springer. pp. 269-274 (Year: 2007).*

Netzsch. Dma 242 E Artemis: Dynamic Mechanical Analyzer. (Retrieved Online Mar. 16, 2020) <https://www.netzsch-thermal-analysis.com/en/products-solutions/dynamic-mechanical-analysis/dma-242-e-artemis/> (Year: 2020).*

Y. Xia, G. M. Whitesides, Angew. Chem. 1998. 110, 5568; Angew. Chem. Int. Ed. 1998, 37, 550 (Year: 1998).*

International Search Report from corresponding International Patent Application No. PCT/EP2013/062922, dated Jan. 16, 2014.

Lin et al., "Role of surfactants in adhesion reduction for step and flash imprint lithography," Journal of Microlithography, Microfabrication and Microsystems, Society of Photo-Optical Instrumentation Engineers, vol. 7, No. 3, pp. 33005-1, Jul. 1, 2008.

Lee et al., "A poly(dimethylsiloxane)-coated flexible mold for nanoimprint lithography," Nanotechnology, IOP Publishing Ltd., pp. 415303, Oct. 17, 2007.

Meskinis et al., "Ion beam synthesis of the diamond like carbon films for nanoimprint lithography applications," Thin Solid Film, Elsevier B.V., vol. 515, No. 2, pp. 636-639, Oct. 1, 2006.

Xin et al., "Transfer imprint lithography using a soft mold," Microelectronic Engineering, Elsevier B.V., vol. 88, No. 8, pp. 2632-2635, Jan. 17, 2011.

* cited by examiner

MOULD WITH A MOULD PATTERN, AND DEVICE AND METHOD FOR PRODUCING SAME

FIELD OF THE INVENTION

The invention relates to a method for the production of a die that has die structures for application of nanostructures on substrates or soft dies, a corresponding device, as well as a structural die.

BACKGROUND OF THE INVENTION

In the semiconductor industry, structuring processes must be carried out on materials in order to be able to produce corresponding functional elements. One of the most important structuring processes of the last decade up until now is still photolithography.

In recent years, however, in addition to photolithography, imprint technology has gained acceptance as a new, alternative structuring technology, which is used not exclusively but at this time even primarily for structuring highly symmetrical, especially repetitive structural elements. By means of imprint technology, surface structures in an embossing material can be created directly by a die process. The advantages that are thus produced are obvious. Chemicals for development and etching that would still be necessary for a photolithographic process can be eliminated. In addition, even now structural values in the nanometer range can be embossed; their production with conventional photolithography would be conceivable only by extremely complicated and, especially, costly units.

In imprint technology, a distinction is made between two types of dies, the hard dies and the soft dies. Each die process can theoretically be carried out with a hard die or a soft die. There are several technical and financial reasons, however, for using the hard die itself only as a so-called master die and from this master die, whenever necessary, forming a soft die, which then is used as an actual structural die. The hard die is thus a negative of the soft die. The hard die is only required for the production of several soft dies. Soft dies can be distinguished from hard dies by different chemical, physical, and technical parameters. A distinction based on the elasticity behavior would be conceivable. Soft dies have a deformation behavior that is primarily based on entropy elasticity, and hard dies have a deformation behavior that is primarily based on energy elasticity. In addition, the two types of dies can be distinguished by, for example, their hardness. Hardness is the resistance that a material puts up against a penetrating body. Since hard dies primarily consist of metals or ceramics, they have correspondingly high hardness values. There are various ways of indicating the hardness of a solid. A very common method is the indication of the hardness according to Vickers. Without going into detail, it can be roughly stated that hard dies are to have Vickers hardness values of greater than 500 HV.

Hard dies specifically have the advantage that they can be directly manufactured by suitable processes such as electron beam lithography or laser beam lithography from a component made of a material with high strength and a high degree of stiffness. Such hard dies have a very high degree of hardness and are thus more or less wear-resistant. The high strength and wear resistance, however, are primarily seen alongside the high costs that are necessary for producing a hard die. Even though the hard die can be used for hundreds of embossing steps, even it will experience significant wear over time. In addition, the demolding of the hard die from the embossing material is technically difficult. Hard dies have a relatively high flexing resistance. They are not especially readily deformable, i.e., in the ideal case, they have to be lifted in the normal direction. In the demolding of the hard die after the embossing process, in this case it can regularly result in a destruction of the embossed nanostructures and/or microstructures, since the hard die has a very high degree of stiffness and therefore can destroy the microstructures and/or nanostructures of the just-molded embossing material. In addition, substrates can have defects that can subsequently lead to damage or destruction of the hard die. If the hard die is only used as a master die, however, the molding process of the soft die from the master die is very readily controllable and is associated with very little wear of the master die.

Soft dies can be manufactured very simply by replication processes from the master die (hard die). In this case, the master die represents the negative that corresponds to the soft die. The soft dies are thus embossed on the master die, accordingly demolded, and then are used as structural dies for embossing the die structures on a substrate. Soft dies can be removed more simply, gently and less problematically from the embossing material than hard dies. In addition, any number of soft dies can be molded by a master die. After a soft die has undergone a certain wear, the soft die is discarded and a new die is formed from the master die.

The problem with the current state of the art consists in that especially soft dies have a very high absorbency of other molecular compounds because of their chemical design. They are thus permeable to other molecular compounds, in contrast to hard dies that consist primarily of metals, ceramics, or glass. In the case of metal and ceramic microstructures, an uptake of molecular substances is ruled out in most cases, since in the case of special hard dies, it can result in an absorption of molecular substances.

During the embossing process with the embossing material, soft dies often absorb a portion of the embossing material. The absorption leads to several undesirable effects, First of all, because of the uptake of molecules of the embossing material, it results in a swelling of the soft die. The swelling is especially problematic in the area of the microstructures and/or nanostructures on the surface of the soft die, since even small amounts of the molecules of the embossing material are sufficient to distort the microstructures and/or nanostructures. Since a soft die is used many times, it absorbs an increasing amount of embossing molecules in the course of its use. The uptake of embossing material molecules decisively reduces the service life of the soft die. The swelling can be measured either directly by means of different probes, such as, for example, the Atomic Force Microscopy (AFM), the Scanning Electron Microscopy (SEM), etc., or indirectly via increases in volume and/or weight. The measurement of the increase of volume and/or weight requires, however, measuring devices with very high resolutions. For example, the measurement of the weight increase by microgravimetric and/or nanogravimetric methods would be conceivable.

In addition, the embossing materials are hardened either thermally or by means of electromagnetic radiation. Especially in the hardening by electromagnetic radiation, the embossing material molecules that have already partially penetrated into the die have a negative effect on the exposure time of the entire embossing material. The reason for this lies in the hardening of the embossing material molecules that have penetrated into the soft die. The embossing material molecules in the soft die are hardened, are thus less transparent, and thus reduce the intensity of the electromagnetic radiation that penetrates the actual embossing material. This problem is equally important for soft dies and hard dies.

The adhesion of the soft die represents a third problem. Soft dies consist primarily of polymers that have physical and/or chemical characteristics that are similar to those of the embossing material. Therefore, it results in an adhesion of the surface of the soft die with the embossing material, which has a negative effect on the characteristic of demolding of the soft die.

SUMMARY OF THE INVENTION

The object of this invention is therefore to enhance the production of structural dies for imprint technology in such a way that the characteristics of the structural die with respect to the period of usability and quality of molding are enhanced.

This object is achieved with the features of the independent claim(s). Advantageous further developments of the invention are indicated in the subclaims. All combinations that consist of at least two of the features indicated in the specification, the claims and/or the figures also fall within the framework of the invention. In the case of the indicated ranges of values, values that lie within the above-mentioned limits are also to be regarded as disclosed as boundary values and can be claimed in any combination.

The invention is a matter of a die, preferably a soft die, which allows an extremely simple demolding of the die from the embossing material because of a coating of the die structure according to the invention, prevents its swelling, and which is not contaminated by the actual embossing material. The coating is accordingly especially impermeable according to the invention relative to the embossing material. It is of special advantage according to the invention when hydrophilicity and hydrophobicity alternate between the embossing material and the coating of the structural die according to the invention. If the embossing material is hydrophobic, the coating of the structural die according to the invention should be hydrophilic and vice versa. In quite special cases, however, it may be of special advantage when structural dies and embossing materials are both hydrophobic. Because of the possibility of selecting the coating of the structural die according to the invention, a material can always be selected that has these marginal characteristics of adhesion relative to the embossing material. In addition, it is therefore advantageous according to the invention when the coating according to the invention is impermeable to the molecules of the embossing material. In addition, it is advantageous according to the invention when the coating according to the invention is as thin as possible in order to ensure as little destruction as possible in the case of a flexed demolding when a soft die is used. Another advantage according to the invention is the especially targeted adjustable surface of the coating. As a result, it is made possible according to the invention to produce an extremely flat and smooth contact surface with the embossing material. Without the coating according to the invention, the embossing material would come into direct contact with the surface of the die during the embossing process, Especially in the case of a soft die, whose surface has an extremely high level of roughness, this would have a negative effect on the structure that is to be embossed. By using a coating according to the invention, first of all, the contact surface with the embossing material is minimized by a smoother surface, and secondly, an interlocking connection of the surfaces is largely avoided. It thus results in a better demolding. The enhanced and more efficient demolding is especially attributed to the fact that the force necessary for demolding is lower, The roughness of the surface of the coating according to the invention is therefore in particular less than 1 µm, preferably less than 100 nm, more preferably less than 10 nm, and most preferably less than 1 nm. The disclosed roughness values apply to the mean roughness and/or the quadratic roughness and/or the averaged depth of roughness.

In a quite special embodiment, the coating according to the invention is electrically conductive. As a result, the electrostatic charging is preferably prevented or at least reduced. Still more preferably, the electrically conductive coating according to the invention can be designed in a grounded manner so that an electrical charging that is produced on the surface thereof is drawn off. Because of the electrically neutral surface, the force, in particular the electrostatic force, is hampered by particles or completely eliminated and thus increases the cleanliness of the die for an extended period. The ground brings into contact the coating according to the invention preferably at the edge.

Hydrophilicity is defined as the high capacity of the surface of a substance for interaction with water. Hydrophilic surfaces are primarily polar and interact correspondingly well with the permanent dipoles of the molecules of fluids, preferably with water. The hydrophilicity of a surface is quantified by means of a contact angle measuring device. In this case, hydrophilic surfaces have very small contact angles. If the coating according to the invention must have a hydrophilic surface in order to be able to be demolded as easily as possible from the embossing material, then the following ranges of values according to the invention are to be considered: A hydrophilic surface according to the invention has in particular a contact angle of less than 90°, preferably less than 60°, more preferably less than 40°, even more preferably less than 20°, and with utmost preference less than 1°.

Hydrophobicity is defined as the low capacity of the surface of a substance for interaction with water. Hydrophobic surfaces are primarily nonpolar and hardly interact with the permanent dipoles of the molecules of fluids. If the coating according to the invention in one embodiment of the invention has a hydrophobic surface in order to be able to be removed as simply as possible from the embossing material, then the following ranges of values according to the invention are to be considered: a hydrophobic surface according to the invention has in particular a contact angle of greater than 90°, preferably greater than 100°, more preferably greater than 120°, even more preferably greater than 140°, and with utmost preference greater than 160°.

The die according to the invention is in particular an imprint die for use in imprint technology. The die is designed either as a hard die for production of soft dies or preferably as a soft die for imprinting substrates. The coating according to the invention of a hard die, which is directly used for imprinting embossing material and not only as a master die, is also conceivable.

Because of the coating according to the invention, the demolding of the die from the embossing material is made possible without impairing and/or (partial) destruction of the structures by the coating preferably having a slight adhesion relative to the embossing material. The adhesiveness between two surfaces can be best described by energy per unit surface, i.e., an energy surface density. This refers to the energy that is necessary to be able to separate two surfaces, connected to one another, along the unit surface. The adhesion according to the invention between embossing material and structural die is in this case in particular less than 2.5 $J/m^2$, preferably less than 1 $J/m^2$, more preferably less than 0.1 J/m², even more preferably less than 0.01 J/m², most preferably less than 0.001 J/m², with utmost preference less than 0.0001 J/m², and most preferably less than 0.00001 J/m², The demolding is thus lighter, faster, more efficient and more economically possible than with a die without a coating or a hard die. It is more economical especially in that because of the elevated demolding speed, the number of embossing steps per unit of time can be increased. In addition, the holding time of the die is drastically increased, so that in this respect, the production costs are also reduced.

In addition, because of the impermeability of the coating, a swelling of the structural die, in particular the soft die, is prevented by the coating, so no embossing material can penetrate into the soft die. Correspondingly, a distortion of the die structure is avoided to the greatest possible extent.

In addition, the exposure time of the embossing material because of the coating of the die is reduced, insofar as the uptake of embossing material in the die structures is blocked by the coating. This is especially advantageous according to the invention, insofar as the embossing material is exposed by the structural die. The coating according to the invention is thus preferably predominantly transparent to the electromagnetic radiation that is used. Since most embossing materials are hardened with UV light, the coating according to the invention is preferably transparent to UV light. The coating according to the invention is therefore in particular transparent in a wavelength range of between 5,000 nm and 10 nm, preferably between 1,000 nm and 100 nm, more preferably between 700 nm and 200 nm, and most preferably between 500 nm and 400 nm.

In particular in addition to the coating, a die surface is preferably designed with a low characteristic of adhesion for the embossing material.

According to another aspect of the invention, the invention is based on the idea of coating the surface of the die, preferably a soft die, with a layer, preferably a metal layer, by a coating process according to the invention.

The die structures and/or the structural die itself comprise in particular at least predominantly, preferably completely, of at least one of the following materials:
  Polymers, in particular
    Polymethylsiloxane (PDMS)
    Perfluoropolyether (PFPE)
    Polyhedral oligomeric silsesquioxane (POSS)
    Polydimethylsiloxane (PDMS)
    Tetraethyl orthosilicate (TEOS)
    Poly(organo)siloxanes (Silicone)
    Thermoplastics
    Thermoset materials
  Metals
  Ceramics
  Glass.

In the case of the soft dies according to the invention, the die structures preferably comprise polydimethylsiloxane (PDMS). In addition, it is conceivable according to the invention to produce the dies, in particular the die structures, from a material combination of the above-mentioned materials. The use of a die and a backplane in series is also conceivable, whereby dies and backplanes comprise in particular of different materials. The use of several different materials leads to the individual or composite dies produced therefrom being referred to as advantageous hybrid dies according to the invention. In this case, the backplane can serve as a stiffener for the die. Backplanes that are extremely flexible and serve only as supports for the dies are also conceivable, however. In particular, the backplane then has a thickness that is less than 1,000 µm, preferably less than 1,000 µm, more preferably less than 500 µm, and most preferably less than 100 µm.

The coating according to the invention is primarily especially effective, however, when the structural die or at least the material of the die structures comprise at least partially of a material that can absorb the embossing material. Accordingly, the die structures of the following materials are especially protected by the coating according to the invention:
  Polydimethylsiloxane (PDMS)
  Polymers
  Perfluoropolyether (PFPE)
  Ceramics.

The coating process according to the invention is preferably one of the following:
  Chemical Vapor Deposition (CVD)
  Physical Vapor Deposition (PVD)
  PE-CVD
  Electrochemical Deposition
  Atomic Layer Deposition (ALD)
  Molecule Layer Deposition (MLD).

Preferred according to the invention is the CVD method, in particular for deposition of chromium.

As a coating material for at least partial coating of the die structures, especially the following materials/material classes are used according to the invention:
  Metals
    Cr, Be, Wi, Cd, Ga, In, Ir, Mg, Mn, Mo, Os, Pa, Rh, Ru, Ta, Ti, V, Zn, Sn, Zr, Cu, Ni, Co, Fe, Pt, Ag, Au, Pb, W, Al
  Semiconductor Materials
    Si, Ge, α-Sn, Se, Te, B, GaP, GaAs, InP, InSb, InAs, GaSb, GaN, AlN, InN, AlxGa1-xAs, InxGa1-xN or oxides of the above-mentioned materials
  Ceramics
    Non-oxide ceramics (carbides, nitrides, borides, silicides)
    Si3N4, BN, SiC
  Oxide Ceramics
    $Al_2O_3$, MgO, $ZrO_2$, TiO, $Ti_2O_3$, $TiO_2$
    Suboxides
  Glass
    Borosilicate glass, quartz ($SiO_2$)
  Polymers
  Organic molecules.

For the coating according to the invention, those materials are preferably selected that have a low adhesion to the embossing material, in particular the following materials:
  Metals, in particular
    Cr, Be, Wi, Cd, Ga, In, Ir, Mg, Mn, Mo, Os, Pa, Rh, Ru, Ta, Ti, V, Zn, Sn, Zr, Cu, Ni, Co, Fe, Pt, Ag, Au, Pb, W, Al.

In an especially preferred embodiment, the die is first coated with the coating material according to the invention and then in addition with an anti-adhesive layer in order to achieve in addition a reduction of the adhesion between coating material and embossing material. The anti-adhesive layer is preferably an organic molecule with a correspondingly low characteristic of adhesion for the embossing material. Should the die already be impermeable to the molecule of the embossing material, just as is the case for the most part, for example, for metal, ceramic or glass dies, a coating according to the invention as a diffusion barrier can be eliminated, and the die can be directly coated with an anti-adhesive layer, in this case as a coating according to the invention. Thus, at least one positive effect relative to the characteristic of demolding is produced based on adhesion.

According to another advantageous embodiment of the invention, only the die surfaces of the structures of the die, i.e., in particular projections of the die structures, which come into contact with an embossing material, are coated. This can be advantageous especially for the nanocontact imprinting.

In a special embodiment, the entire surface of the die structures of the die is coated with the coating according to the invention.

The layer thickness of the coating according to the invention is in particular less than 1 mm, preferably less than 100 μm, more preferably less than 10 μm, most preferably less than 1 μm, with utmost preference less than 100 nm, and most preferably less than 10 nm.

The extremely small layer thicknesses also have a positive effect on the transparency of the electromagnetic radiation that is used. A solid can absorb only photons that interact with a particle (for example: an electron) or a quasiparticle (in particular, an optical phonon) in the solid. These effects are sufficiently known to any physicist. Now, these interactions specifically cannot be avoided, but it is possible to increase the number of photons by the intensity of the electromagnetic radiation, or to reduce the number of particles (or quasiparticles) in the solid by the reduction of the layer thickness according to the invention, in such a way that first, i.e., the photons predominate, and second, i.e., the particles and quasiparticles predominate. Thus, the solid no longer engages in the same excitation as the particles (or quasiparticles), and according to the invention, the photons are put into the position, owing to the reduction in the layer thickness of the coating, of being able to penetrate inherently nontransparent solids. The solid is at least partially transparent because of the layer thickness. It is therefore disclosed that the small thickness of the coating according to the invention has a positive effect on the amount of the photons that penetrate the coating. This in turn has a positive effect on the hardening of the embossing material that is covered by the coating.

In the UV hardening of the embossing material, the coating material according to the invention is preferably at least partially transparent for the wavelength range of the electromagnetic radiation, which the embossing material cross-links. In this case, the optical transparency is greater than 0%, preferably greater than 20%, more preferably greater than 50%, most preferably greater than 80%, and with utmost preference greater than 95%. The wavelength range for the optical transparency has a value of in particular between 100 nm and 1,000 nm, preferably between 150 nm and 500 nm, more preferably between 200 nm and 400 nm, and most preferably between 250 nm and 350 nm.

If the embossing material is to be thermally hardened, the die—in particular the coating according to the invention—has a heat conductivity that is as high as possible. In this case, the heat conductivity is greater than 0.1 W/(m*K), preferably greater than 1 W/(m*K), preferably greater than 10 W/(m*K), most preferably greater than 100 W/(m*K), and with utmost preference greater than 1,000 W/(m*K).

The structural die with a coating is designed in particular to be temperature-stable. The structural die can be used in particular at temperatures of higher than 25° C., preferably higher than 100° C., more preferably higher than 500° C., most preferably higher than 1000° C., and with utmost preference higher than 1500° C.

The ratio between the thermal expansion coefficient of the coating material and the thermal expansion coefficient of the die material is smaller than 10,000, preferably smaller than 1,000, more preferably smaller than 100, even more preferably smaller than 10, most preferably smaller than 5, and with utmost preference exactly 1.

Additional features of the invention follow from the claims, the subsequent description of the figures, as well as the drawings.

DETAILED DESCRIPTION OF THE INVENTION

In the further embodiments, the production of a die 1, provided with a ground 4 and coated with a layer 5 according to the invention, is disclosed.

Figure 1:
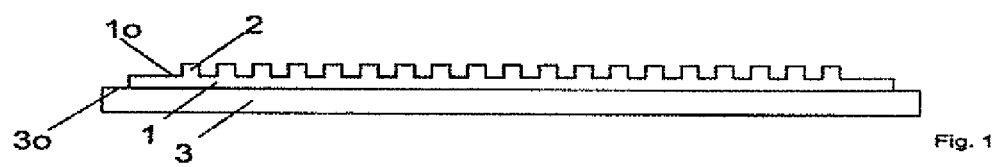
FIG. 1 is a diagrammatic cross-sectional depiction of a die in a first production step according to the invention.

In a first production step according to FIG. 1, a die 1 is fastened to a die surface 1o and structures 2 to a backplane 3.

Figure 2:
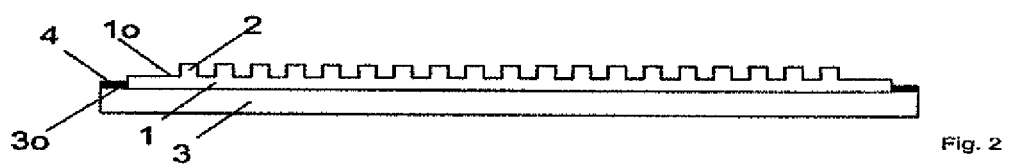
FIG. 2 is a diagrammatic cross-sectional depiction of a die in a second production step according to the invention.

In a second production step according to FIG. 2, deposition of an electrically conductive layer, a ground 4, lateral to the die 1, arranged in particular in a circle, preferably exclusively on the lateral peripheral edge, is carried out on the backplane surface 3o of the backplane 3.

Figure 3:
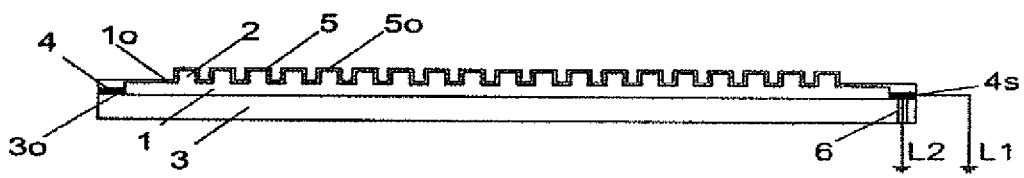
FIG. 3 is a diagrammatic cross-sectional depiction of a die in a third production step according to the invention.

In a third production step according to FIG. 3, the coating of the die 1 is carried out with a coating 5 according to the invention such that the coating 5 also makes contact with the ground 4, and in particular at least predominantly, preferably completely, covers it, and thus a conducting contact between the coating surface 5o and the ground 4 is produced.

The ground 4 preferably completely encompasses the die 2. The electrical charge can be removed, for example, on the side 4s of the ground 4 via a line L1. Alternatively or in addition, the production of a hole 6 through the backplane 3 would also be conceivable in order to remove the charge via a line L2.

If a backplane 3 can be eliminated, it is in particular conceivable to deposit the ground 4 directly on the edge of the die 1.

REFERENCE SYMBOL LIST

1 Die
1o Die Surface
2 Structures
3 Backplane
3o Backplane Surface
4 Ground
5 Coating
5o Coating Surface
6 Hole
L1, L2 Lines Having described the invention, the following is claimed:
1. A soft die comprising:
die structures for applying microstructures and/or nanostructures on a substrate, said die structures having a deformation behavior primarily based on entropy elasticity;
an electrically conductive ground layer; and a coating material that at least partially coats the die structures, the coating material being:
(i) transparent to UV-light,
(ii) electrically conductive, and
(iii) comprised of a metal selected from the group comprising: Cr, Be, Wi, Cd, Ga, In, Ir, Mg, Mn, Mo, Os, Pa, Rh, Ru, Ta, Ti, V, Zn, Sn, Zr, Cu, Ni, Co, Fe, Pt, Ag, Au, Pb, W and Al,
wherein said coating material is electrically connected to the ground layer to provide an electrically neutral coating surface, said coating surface having a roughness value of less than 10 nm, the roughness value applying to at least one of mean roughness, quadratic roughness, and average depth of roughness,
wherein the coating material forms a protective layer that prevents contamination of the soft die during use of the soft die, and wherein the soft die is demolded from the embossing material by bending the soft die.

2. A soft die according to claim 1, wherein the die structures are comprised of a hardened polymer.

3. The soft die according to claim 2, wherein the hardened polymer is selected from the group comprising: an elastomer, a siloxane, and a polydimethylsiloxane (PDMS).

4. The soft die according to claim 1, wherein the ground layer is located at a peripheral edge of the soft die.

5. The soft die according to claim 1, wherein the soft die further comprises a line that electrically connects the ground layer to ground.

6. The soft die according to claim 1, wherein the coating surface of said coating material adheres to a surface of a material embossed by the soft die with an adhesion of less than 2.5 $J/m^2$.

* * * * *